United States Patent (10) Patent No.: US 11,233,517 B2
Lee et al. (45) Date of Patent: Jan. 25, 2022

(54) AUTO TRIMMING DEVICE FOR OSCILLATOR AND METHOD OF AUTO TRIMMING DEVICE FOR OSCILLATOR

(71) Applicant: MagnaChip Semiconductor, Ltd., Cheongju-si (KR)

(72) Inventors: Yong Sup Lee, Cheongju-si (KR); Gil Sung Roh, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/918,233

(22) Filed: Jul. 1, 2020

(65) Prior Publication Data

US 2021/0203327 A1 Jul. 1, 2021

(30) Foreign Application Priority Data

Dec. 27, 2019 (KR) .......................... 10-2019-0176474

(51) Int. Cl.
*H03L 7/06* (2006.01)
*G06F 1/08* (2006.01)
*H03L 7/181* (2006.01)

(52) U.S. Cl.
CPC .................. *H03L 7/06* (2013.01); *G06F 1/08* (2013.01); *H03L 7/181* (2013.01)

(58) Field of Classification Search
CPC ... H03L 7/00; H03L 7/06; H03L 7/085; H03L 7/18; H03L 7/181; H03K 3/02315; H03K 3/0231; H03K 3/0315; G06F 1/08
See application file for complete search history.

(56) References Cited

U.S. PATENT DOCUMENTS

| | | | | |
|---|---|---|---|---|
| 5,459,435 A | * | 10/1995 | Taki | ........................ H03L 7/085 327/141 |
| 8,432,230 B2 | | 4/2013 | Peng | |
| 2013/0187722 A1 | * | 7/2013 | Choi | ..................... G11C 16/105 331/1 A |

FOREIGN PATENT DOCUMENTS

KR 10-1876997 B1 7/2018

* cited by examiner

*Primary Examiner* — Ryan Johnson
(74) *Attorney, Agent, or Firm* — NSIP Law

(57) ABSTRACT

An auto trimming device includes an oscillator configured to generate an oscillator clock signal, a subtractor configured to receive an expected value for a target frequency and the oscillator clock signal, configured to output a difference value between the expected value and the oscillator clock signal, an index value selector configured to calculate a unit index value using the difference value and configured to detect and output a target index value from the unit index value, an index value register configured to output an oscillator trimming code corresponding to the target index value to the oscillator, and an embedded memory configured to store the oscillator trimming code as a target oscillator trimming code for the target frequency.

21 Claims, 7 Drawing Sheets

AUTO TRIMMING DEVICE FOR OSCILLATOR AND METHOD OF AUTO TRIMMING DEVICE FOR OSCILLATOR

CROSS-REFERENCE TO RELATED APPLICATIONS

This application claims the benefit under 35 U.S.C. 119(a) of Korean Patent Application No. 10-2019-0176474 filed on Dec. 27, 2019 in the Korean Intellectual Property Office, the entire disclosure of which is incorporated herein by reference for all purposes.

BACKGROUND

1. Field

The following description relates to an auto trimming device for an oscillator. The following description also relates a method of an auto trimming device for an oscillator.

2. Description of Related Art

Certain related art uses a method of outputting an oscillator frequency to an OUT_PAD and directly measure such an oscillator frequency using test equipment, as shown in FIG. 1 at (a). However, when measuring such a high frequency oscillator, a parasitic RC component may exist between OUT_PAD and a probe of the test equipment that influences the waveform of the high frequency output to be distorted as illustrated in FIG. 1 at (b) so that the measurement of the frequency may not be correct or the measurement itself may be impossible due to the limitations of measurable frequency with respect to the text equipment.

In order to improve the problem of the waveform being distorted in the related art, a frequency divider is added, as shown in FIG. 1 at (c). Such a frequency divider divides the frequency of the oscillator clock OSC_CLK in order to reduce the distortion of the output waveform as illustrated in FIG. 1 at (d). As a result, the accuracy is increased but the measuring time is increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an auto trimming device includes an oscillator configured to generate an oscillator clock signal, a subtractor configured to receive an expected value for a target frequency and the oscillator clock signal, configured to output a difference value between the expected value and the oscillator clock signal, an index value selector configured to calculate a unit index value using the difference value and configured to detect and output a target index value from the unit index value, an index value register configured to output an oscillator trimming code corresponding to the target index value to the oscillator, and an embedded memory configured to store the oscillator trimming code as a target oscillator trimming code for the target frequency.

The subtractor may be configured to receive a reference time signal, the expected value may be a number of clocks of the target frequency during a section in which the reference time signal is high, and the difference value may be a value obtained by subtracting the number of clocks of the oscillator clock signal during the section in which the reference time signal is high from the expected value.

The index value selector may include a divider configured to calculate a unit index value from the difference value, a binary searcher configured to search for a target index value from the difference value to output a search result, and an index value calculator configured to calculate the target index value using the unit index value or the search result.

The index value selector may include a current index value register configured to maintain a target index value output from the index value selector until the next target index value is output.

The index value calculator may be configured to calculate the target index value using the unit index value only at the time of initial calculation.

The index value calculator may be configured to calculate the target index value using a search result of the binary searcher for a predetermined number of times after outputting the target index value using the unit index value.

The auto trimming device may further include a comparator configured to receive an output of the subtractor.

The auto trimming device may further include a minimum value register configured to provide a target difference value compared with the subtractor output in the comparator.

The embedded memory may be configured to store the oscillator trimming code as the target oscillator trimming code, in response to the difference value being within a predetermined range, or configured to store the oscillator trimming code corresponding to the case when the difference value is a minimum as the target oscillator trimming code, in response to the index value register receiving the target index value for a predetermined number of times.

The auto trimming device may further include an average calculator configured to receive the difference value for a plurality of times and to calculate and output an average difference value from a plurality of difference values, wherein the index value selector may be configured to detect the target index value using the average difference value.

In another general aspect, an auto trimming device includes an oscillator configured to generate an oscillator clock signal, a subtractor configured to receive an expected value for a target frequency and the oscillator clock signal to output a difference value between the expected value and the oscillator clock signal, an index value selector configured to calculate a unit index value using the difference value and configured to detect a target index value from the unit index value to provide to the oscillator, an index value register configured to receive and store the target index value, and an embedded memory configured to store the target index value for the target frequency.

The embedded memory may be configured to store a target index value in response to the difference value being within a predetermined range, or a target index value corresponding to the case when the difference value is a minimum, in response to the index value register receiving the target index value for a predetermined number of times.

In another general aspect, a method for auto trimming includes calculating a difference value, by using a subtractor, to output a difference between an expected value of a target frequency and a number of clock of an oscillator signal as a difference value during a section in which a reference time signal is high, calculating a target index value, by using an index value selector, to calculate a unit index value using the difference value, and detecting and outputting the target index value from the unit index value, sending the target index value, by using an index value register, to output an oscillator trimming code corresponding to the target index value to an oscillator, and storing the target index value, by using an embedded memory, to store the oscillator trimming code as a target oscillator trimming code.

The calculating the target index value may include performing a unit calculating, by using a divider, to calculate a unit index value from the difference value, and using an index value calculator to calculate and output the target index value from the unit index value, and performing a fine calculating, by using a binary searcher, to search for a target index value from the difference value and to output a search result, and using the index value calculator to calculate and output the target index value from the search result.

The calculating the target index value may include initially performing the unit calculating, and then performing the fine calculating.

The sending the target index value may include determining a minimum value, in which a comparator receives the difference value, and outputting a smaller value from among a minimum value previously stored in a minimum value register and the difference value as a target difference value.

The storing the target index value may include storing, by the embedded memory, the oscillator trimming code as the target oscillator trimming code in response to the difference value being within a predetermined range or storing the oscillator trimming code, corresponding to the case when the difference value is a minimum as the target oscillator trimming code, in response to the index value register receiving the target index value for a predetermined number of times.

The storing the target index value may include outputting a target oscillator trimming code stored in the embedded memory, from a minimum value register, in response to the difference value being within a predetermined range.

The storing the target index value may include outputting the target oscillator trimming code stored in the embedded memory, from the index value register or a minimum value register, in response to the target index value being received by the index value register for a predetermined number of times.

The calculating a difference value may include performing a first calculating, in which the subtractor calculates and outputs the difference value, and performing a second calculating, in which an average value calculator calculates and outputs an average difference value from the plurality of difference values after receiving the difference value for a plurality of times, wherein the calculating the target index value includes detecting, using the index value selector, the target index value using the average difference value.

In another general aspect, a method for auto trimming includes calculating a difference value, by using a subtractor, to output a difference between an expected value of a target frequency and a number of clock of an oscillator signal as a difference value during the section in which a reference time signal is high, calculating a target index value, by using an index value selector, to calculate a unit index value using the difference value, and detecting and outputting the target index value from the unit index value, the calculating including a unit calculating and a fine calculating, and sending the target index value, by using an index value register, to output an oscillator trimming code corresponding to the target index value to an oscillator for storage as a target oscillator trimming code.

The unit calculating may include using a divider to calculate a unit index value from the difference value, and using an index value calculator to calculate and output the target index value from the unit index value.

The fine calculating may include using a binary searcher to search for a target index value from the difference value and output a search result, and using an index value calculator to calculate and output the target index value from the search result.

The target oscillator trimming code may be stored in an embedded memory.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
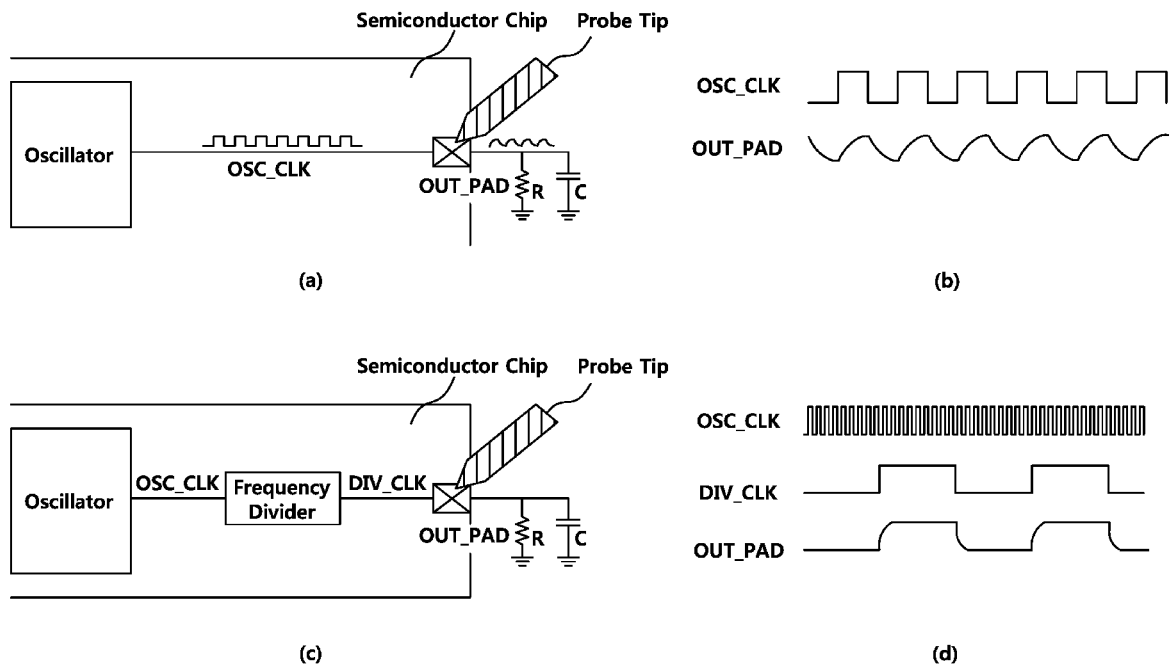
FIG. 1 illustrates a trimming method of an oscillator of an alternative art, according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Terms such as "including" or "comprising" used in the embodiments should not be construed as necessarily including all of various components, or various operations described in the specification, and it should be construed that some of the components or some of the operations may not be included or may further include additional components or operations.

The use of the term "may" herein with respect to an example or embodiment (e.g., as to what an example or embodiment may include or implement) means that at least one example or embodiment exists where such a feature is included or implemented, while all examples are not limited thereto.

With reference to the accompanying drawings, an auto trimming device and method of the oscillator according to an example auto trimming device are described in greater detail.

The following description also relates to an auto trimming device for an oscillator performing auto trimming by detecting a target index value and a corresponding method.

The following description describes a way to provide an auto trimming device for an oscillator with an improved accuracy while also reducing the time required for auto trimming and a corresponding method.

Figure 2:
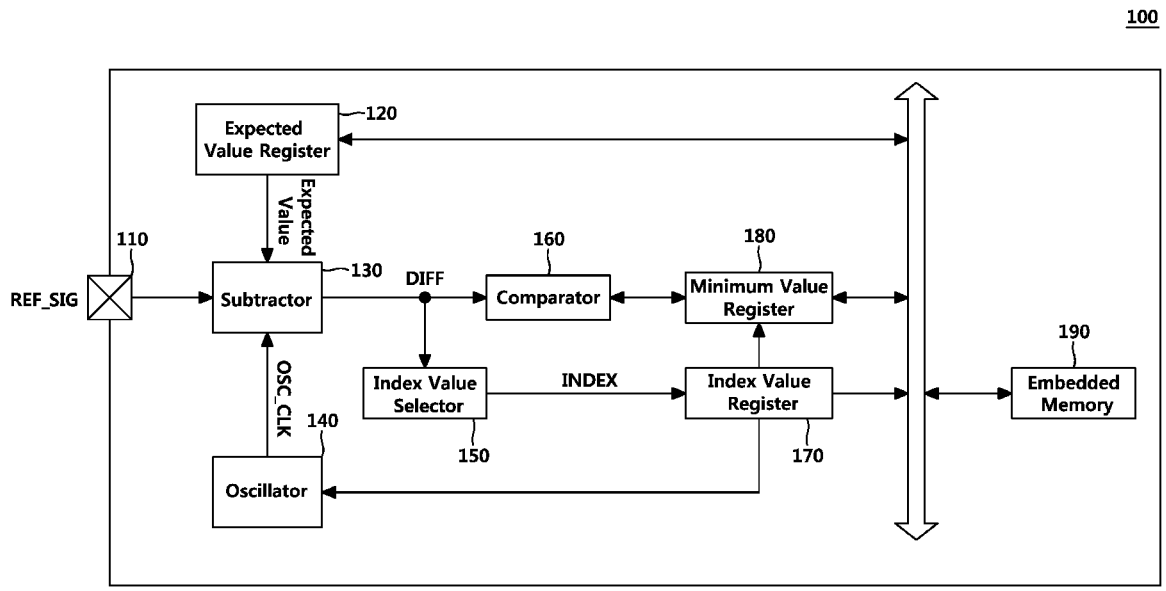
FIG. 2 illustrates the configuration of an auto trimming device of an oscillator, according to one or more examples.

FIG. 2 illustrates a configuration of an auto trimming device for an oscillator, according to one or more examples.

Referring to FIG. 2, the auto trimming device 100 for the oscillator according to an example may include a reference time receiver 110, an expected value register 120, a subtractor 130, an oscillator 140, an index value selector 150, a comparator 160, an index value register 170, a minimum value register 180, and an embedded memory 190, according to a non-limiting example.

The reference time receiver 110 may receive a reference time signal REF_SIG for calculating a target frequency of the oscillator 140 from the outside of the auto trimming device 100.

Next, the expected value register 120 may output the expected value. Specifically, the expected value register 120 may output the expected value for the target frequency to the subtractor 130. For example, the expected value may be a number of clocks of the target frequency during the section in which the reference time signal REF_SIG is high.

The oscillator 140 may generate and output an oscillator clock signal. More particularly, the oscillator 140 may generate and output the oscillator clock signal according to a corresponding oscillator trimming code.

The subtractor 130 may output a difference value DIFF between the expected value and the oscillator clock signal. More particularly, the subtractor 130 may count the number of clocks of the clock signals of the oscillator, during the section in which the reference time signal REF_SIG is high. The subtractor 130 may output a value obtained by subtracting the counting result from the expected value as a difference value DIFF.

The index value selector 150 may detect and output a target index value obtained using the difference value DIFF. More particularly, the index value selector 150 may calculate a unit index value from the difference value DIFF and may detect and output a target index value using the unit index value.

An index value refers to a bit value indicating a specific frequency and the target index value denotes an index value corresponding to the target frequency.

The unit index value may a unit, referred to as UNIT_STEP, including a plurality of index values and an index value used to detect the target index value.

Specifically, in the case the unit UNIT_STEP has a value of 100, for example, increasing the unit index value by 1 may correspond to increasing the index value by 100. The unit index value may be a head value of an array including 100 index values. If the total index value exists up to a value of 1000, index value numbers 1, 101, 201 . . . 901 and the like may correspond to a unit index value, in such an example. The unit index values may be separately distinguished as corresponding to unit index values 1, 2 . . . and so on. However, the present disclosure is not limited to these enumerated non-limiting examples, and the value of the unit UNIT_STEP may be set to another value in consideration of optimizing and/or managing aspects of the operation efficiency of the index value selector 150.

The index value selector 150 detects a unit index value corresponding to the target frequency in a large range using the unit index value, and then operates based on the corresponding unit index value in a fine range, which is used to detect the index value corresponding to the target frequency, using the index value as a basis to output the target index value. Details of the calculation of the index value selector 150 will be described in greater detail later with reference to FIG. 4.

The comparator 160 may receive the difference value and output such a difference value as a target difference value. The minimum value register 180 may store the target difference value output by the comparator 160.

Specifically, the comparator 160 may output a smaller value from among the received difference value and the minimum value previously stored in the minimum value register 180 as a target difference value. The minimum value stored in the minimum value register 180 for the first time may be set to an appropriate maximum value. In such an example, because the initial difference value is smaller than the minimum value stored for the first time, the comparator 160 may output the initial difference value as the target difference value.

The index value register 170 may output an oscillator trimming code, corresponding to the target index value. Specifically, when the target index value and the oscillator trimming code are different, the index value register 170 may receive the target index value from the index value selector 150 and may output the corresponding oscillator trimming code to the oscillator 140 and may store the output oscillator trimming code accordingly.

The embedded memory 190 may be a Merged Flash & Logic (MFL) device in which a flash memory and logic elements are merged together. Because such architecture may implement individual memory and logic together in one chip, such an approach may have the advantages of miniaturization, low power, high speed and low electromagnetic interference (EMI) noise implementation.

The embedded memory 190 may include a control region and a storage region. Such a control region may store various program codes and/or machine instructions necessary for driving the auto trimming device 100 and transmit control signals to each component as appropriate.

The storage region may store an oscillator trimming code corresponding to an expected value for each frequency and may also store a target index value.

The control region may act to control so as to terminate the auto trimming operation of the auto trimming device 100 when the difference value DIFF satisfies a predetermined condition.

The predetermined condition, according to an example, may be a case where the difference value is within a predetermined range. More particularly, the predetermined range may be a non-limiting example in which the target difference value stored in the minimum value register 180 is in a range of greater than −1 and less than 1. When the target difference value satisfies such a predetermined range, the minimum value register 180 may receive an oscillator trimming code corresponding to the target difference value, from the index value register 170, and may output the oscillator trimming code into the embedded memory 190 in order to terminate the auto trimming operation of the auto trimming device 100. However, the present disclosure is not to these non-limiting examples of values and may be set to another value in consideration of the frequency difference between the index values.

According to an example, the predetermined condition may be an example in which the index value register 170 receives the target index value more than a predetermined number of times. More particularly, the predetermined number of times may be the number of bits of the index value −1. Thus, for example, when the index value corresponding to the frequency is 9 bits of information, the predetermined number of times may be 8 times, being one less than the index value. However, the present disclosure is not limited to such a non-limiting example, and the predetermined number of times may be set to a smaller or greater value in consideration of optimizing and/or managing the efficiency of the auto trimming operation.

As described above, the auto trimming device 100 for the oscillator according to the example may detect the target index value by dividing a large range, according to the unit index value, and a small range according to the index value, which may thereby improve the speed and/or the accuracy of the auto trimming process.

Figure 3:
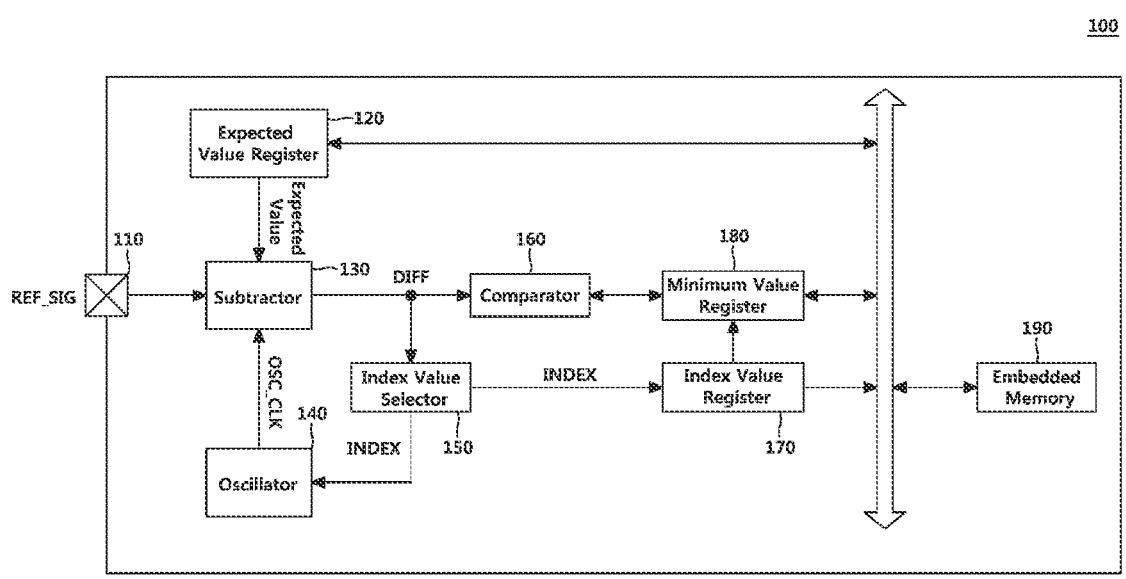
FIG. 3 illustrates another configuration of an auto trimming device for an oscillator, according to one or more examples.

FIG. 3 illustrates another configuration of an auto trimming device for an oscillator, according to one or more examples.

Referring to FIG. 3, the index value selector 150 may output a target index value to the oscillator 140 when the target index value and the oscillator trimming code are the same, and may store the target index value to the index value register 170 accordingly. Operation of the remaining components is the same as the description of FIG. 2, omitted for brevity.

Figure 4:
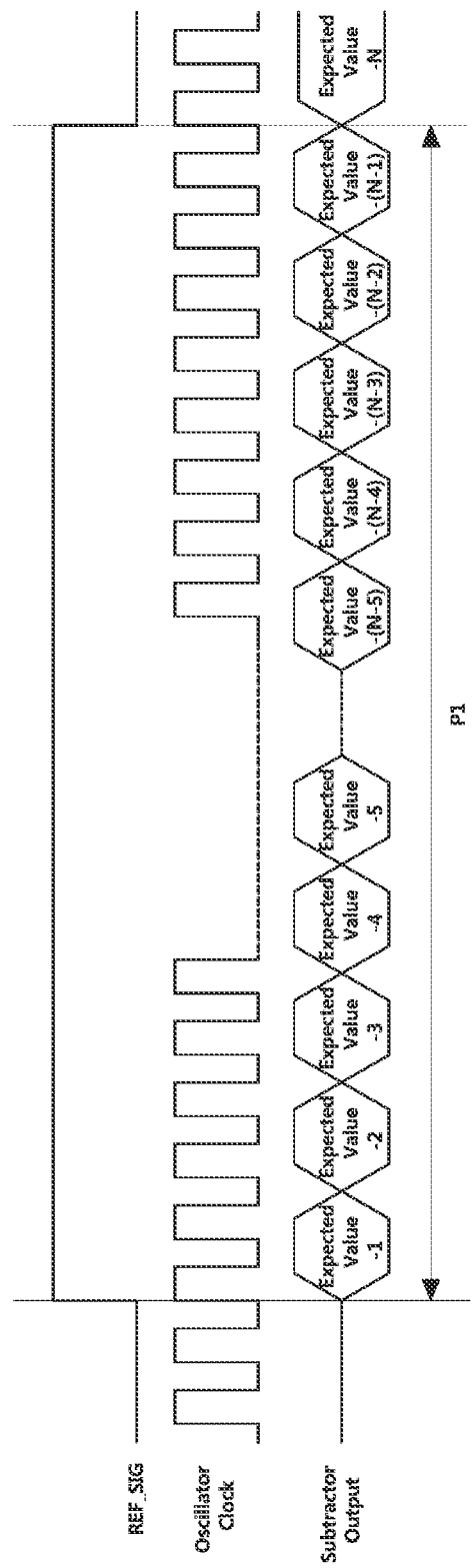
FIG. 4 is a timing diagram illustrating an operation of a subtractor, according to one or more examples.

FIG. 4 is a timing diagram illustrating the operation of the subtractor, according to one or more examples.

The subtractor 130 may output the value obtained by subtracting the number of clocks of the oscillator clock signal from the expected value of the section, of which the reference time signal REF_SIG may be high or 1, as a difference value DIFF. More particularly, with reference to FIG. 4, the subtractor 130 may count the number of clocks of the oscillator clock signal during P1 section, and may finally output "the expected value−(N−1)" as the value of the difference value DIFF.

Therefore, the output of the subtractor DIFF may be expressed as Equation 1, below.

Difference value DIFF=Expected value−Number of clocks of the oscillator during the section of which the reference time signal REF_SIG is 1    Equation 1:

An oscillator frequency that is being trimmed, that is, the current oscillator frequency may be calculated as Equation 2, below.

Current Oscillator Frequency=((Expected Value−Difference Value DIFF)*Target Frequency)/Expected Value.    Equation 2:

When the difference value DIFF is 0 as a result of Equation 2, that is, when the expected value and the number of oscillator clocks are the same, the current oscillator frequency then may become equal to the target frequency.

Figure 5:
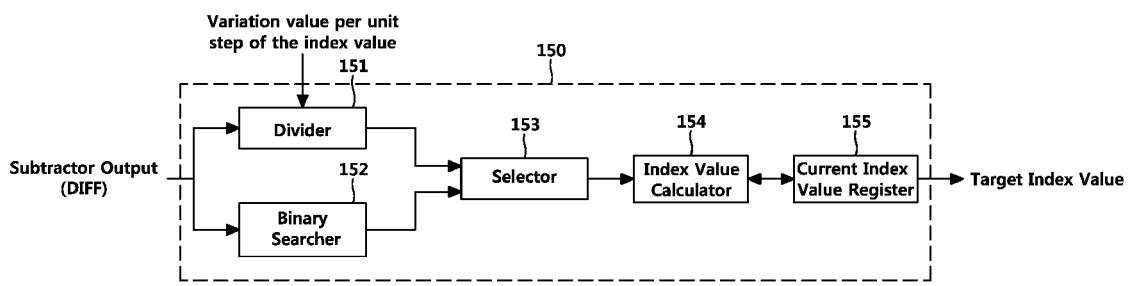
FIG. 5 illustrates a process of outputting a target index value by an index value selector, according to one or more examples.

FIG. 5 illustrates a process of outputting a target index value by an index value selector, according to one or more examples.

The index value selector 150 may detect and output a target index value in a large range and a small range by using the difference value DIFF which is an output of the subtractor.

Specifically, referring to FIG. 5, the index value selector 150 may include a divider 151, a binary searcher 152, a selector 153, an index value calculator 154, and a current index value register 155, as a non-limiting example.

The divider 151 may calculate a unit index value from the difference value DIFF. More particularly, the divider 151 may calculate a unit index value using the variation value per unit step of the index value. The variation value per unit step of the index value may be a frequency variation value between adjacent index values*unit (UNIT_STEP), calculated as such a product.

According to an example, when the unit (UNIT_STEP) is 100 and the frequency variation value is 10, the variation value per unit step of the index value is 1000, or the product of the unit and the frequency variation value. When the difference value DIFF output by the subtractor 130 is +1000, the divider 151 may set +1 (+1000/1000) as the unit index variation value OFFSET1, and, assuming that the initialized unit index value is 1, the divider 151 may add the unit index variation value OFFSET1 to the initialized unit index value and may output 2 as a unit index value.

The binary searcher 152 may search for a target index value from the difference value DIFF in order to output a search result. More particularly, the binary searcher 152 may perform a binary search based on an index value which is a reference and outputs a search result. Here, the binary search refers to a search method of reducing a search range by ½ by comparing a reference value with a target value.

If the sign of the difference value DIFF received by the binary searcher 152 is positive, the current oscillator frequency is to be increased because it is lower than the target frequency, and if it is negative, it is to be lowered because it is higher than the target frequency. Therefore, the binary searcher 152 may output a search result, as illustrated in Equation 3, below, according to the sign of the difference value DIFF.

Search result=±2$^{M-N}$    Equation 3:

In Equation 3, M is the number of bits of the index value and N denotes the number of times of the binary search. The sign of the search result may be taken to be the same as the sign of the difference value DIFF. In an example in which the binary search is for the first time, where the number of bits of the index value is 9 and the sign of the difference value DIFF is positive, the binary searcher 152 may output +2$^{9-1}$, that is, +256, as the search result.

The selector 153 may selectively send the output value of the divider 151 or the output value of the binary searcher 152 to the index value calculator 154. More specifically, the selector 153 may send the output value of the divider 151 at the time of initial calculation and may send the output value of the binary searcher 152 from the next calculation.

The index value calculator 154 may calculate the target index value using the output value of the divider 151 or the output value of the binary searcher 152.

More specifically, the index value calculator 154 may calculate the target index value using the value sent by the selector 153.

The selector 153 may send the output value of the divider 151 at the time of initial calculation. The output value of the divider 151 may be a unit index value, and the index value calculator 154 may calculate a target index value corresponding to the unit index value. More specifically, for example, when the unit (UNIT_STEP) is 100 and the unit index value output by the divider 151 is 2, the corresponding target index value may then be 101. Therefore, the index value calculator 154 may output 101 as the target index value.

After the time of second calculation, the selector 153 may then send the output value of the binary searcher 152. The output value of the binary searcher 152 may be a search result of binary search, and the search result may be added to the first target index value, for example, 101, of the index value calculator 154 in order to calculate the second target index value. If the search result is +256, the second target index value may be 357.

The current index value register 155 may serve to maintain the output of the current target index value before the new target index value is output by the current target index value.

Figure 6:
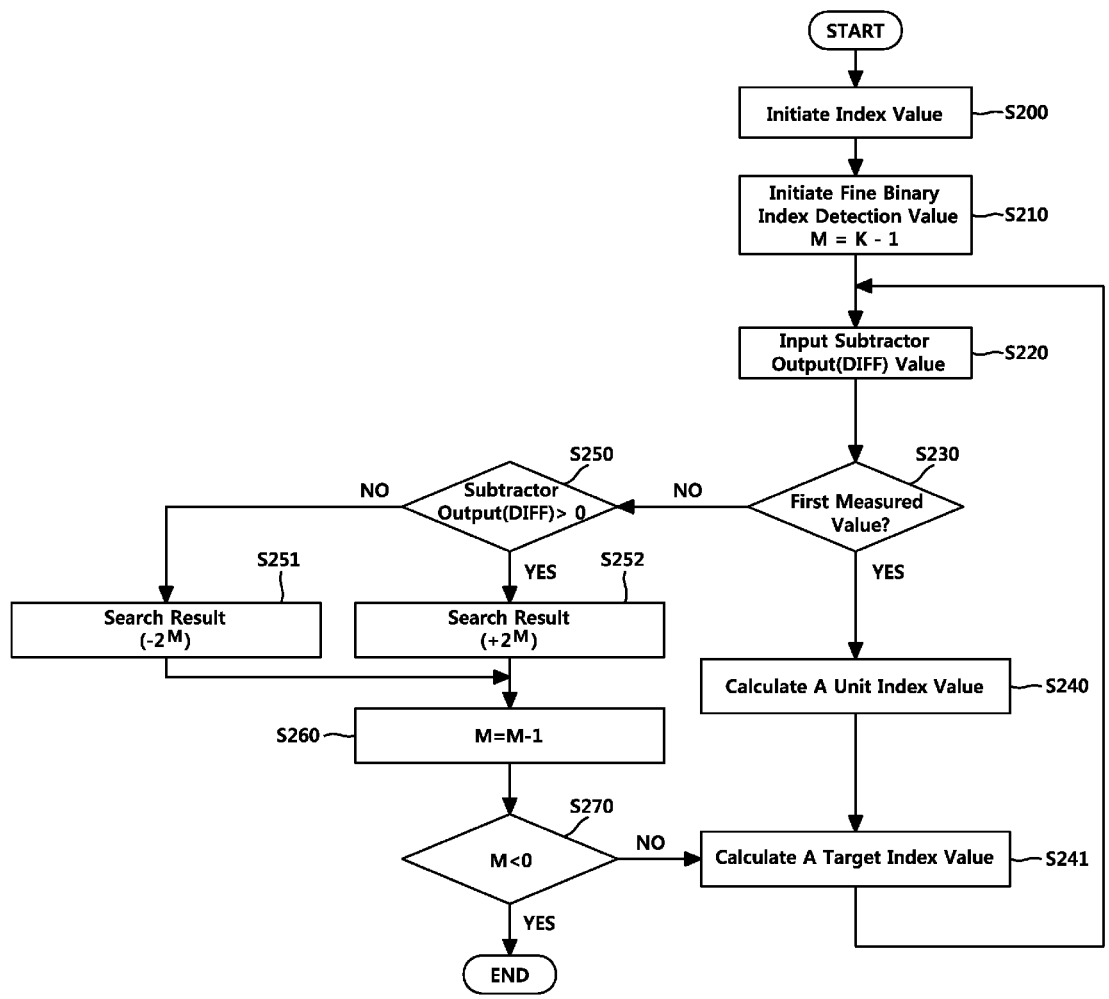
FIG. 6 is a flow chart illustrating an operation of an index value selector, according to one or more examples.

FIG. 6 is a flowchart illustrating an operation of an index value selector according to one or more examples.

For convenience of explanation, it is assumed that the index value is 9-bit information, the initialized unit index value or the index value is 1 and the frequency corresponding to the index value 1 is 10000 Hz, the difference of the frequency between the index values is 10 Hz, and the unit (UNIT_STEP) is 100. However, these are only non-limiting examples used to aid in comprehension, and other examples use other values for these examples.

Referring to FIG. 6, in operation S200, the index value selector 150 may initialize unit index values or index values. The initialized unit index value may be 1 and the corresponding index value may be 000000001.

In operation S210, the index value selector 150 may initialize the fine binary index detection value, which corresponds to the number of repetitions M used for detecting the index value in a small range. In such an example, K is the number of bits of the index value. Also, in such an example, the number of repetitions M is 8.

In operation S220, the index value selector 150 may receive the output value DIFF of the subtractor 130.

Because the output value DIFF corresponds to a difference between an expected value corresponding to a target frequency during a section in which the reference time signal is high and the number of clocks of the oscillator, the frequency is not necessarily the same, but is assumed to be the same for convenience of understanding, in the present non-limiting example. For example, when the target frequency is 12530 Hz, the subtractor 130 may output 12530−10000=+2530 as an output value DIFF.

In operation S230, in an example where the output value DIFF is the first measured value, the divider 151 may perform operation S240 by the selector 153. More particularly, the divider 151 may calculate and output a unit index value. Because the variation value per unit step of the index value may be 10*100=1000, the divider 151 may be 2530/1000=2.5, that is, the divider 151 adds an integer 2 as a unit index variation value OFFSET1 to the initialized unit index value 1. Therefore, the divider 151 outputs 3 as a unit index value, in such an example.

In operation S241, the index value calculator 154 may output an index value corresponding to the unit index value as a target index value. Because the size of the unit (UNIT_STEP) may be 100, the corresponding index value may be 1 in an example where a unit index value is 1, the corresponding index value may be 101 in an example where the unit index value is 2, and the corresponding index value may be 201 in an example where the unit index value is 3. The index value calculator 154 may output 201 as a target index value.

In operation S230, in an example where the output value DIFF is not the same as the first measurement value, the binary searcher 152 may perform operation S250 by the selector 153. If the sign of the subtractor output DIFF is a negative number, $-2^M$ is output as a search result in operation S251, and if a sign of the subtractor output DIFF is a positive number, $+2^M$ is output as a search result in operation S252.

Specifically, the frequency corresponding to the target index value 201 of the first round may be 12000 Hz. Thus, the subtractor 130 may output 12530−12000=+530 as a difference value DIFF. The binary searcher 152 may output $+2^{9-1}=+256$ as a search result, because the sign of the difference value DIFF is positive.

In operation S260, the index value selector 150 subtract 1 from the number of searches M.

In operation S270, in an example where the number of searches M is less than 0, the index value selector 150 may end the index value selection. If the number of searches M is greater than or equal to 0, the process may returns to operation S241, and the index value calculator 154 may calculate a target index value using the search result. Specifically, the index value calculator 154 may output 457, which is a value obtained by adding a search result +256 to the first target index value 201, as a target index value.

Figure 7:
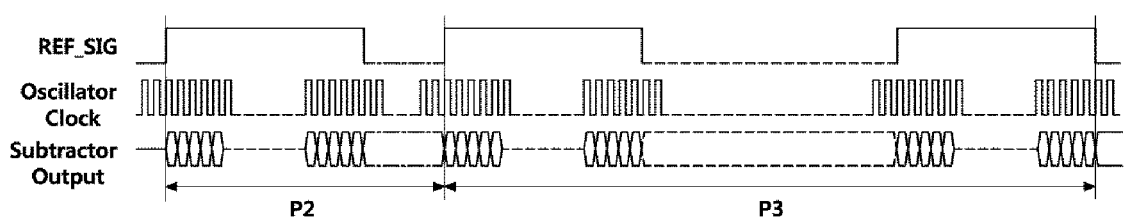
FIG. 7 is a timing diagram illustrating a target index value calculation section, according to one or more examples.

A summary of the calculation of the target index value according to the repeated binary search is presented as Table 1, below:

As described above, the auto trimming device 100 for the oscillator according to one or more examples detects a target index value by dividing a large range using a unit index value and a small range using an index value, thereby performing auto trimming more quickly. FIG. 7 is a timing diagram illustrating a target index value calculation section, according to one or more examples.

Referring to FIG. 7, P2 is a section of FIG. 7 used for detecting a target index value for the first time. At P2, the selector 153 may send the output value of the divider 151 to the index value calculator 154. The selector 153 may then send the output value of the binary searcher 152 to the index value calculator 154 in the next section P3. The detailed calculation method may be the same as the description with reference to FIGS. 5 and 6.

Figure 8:
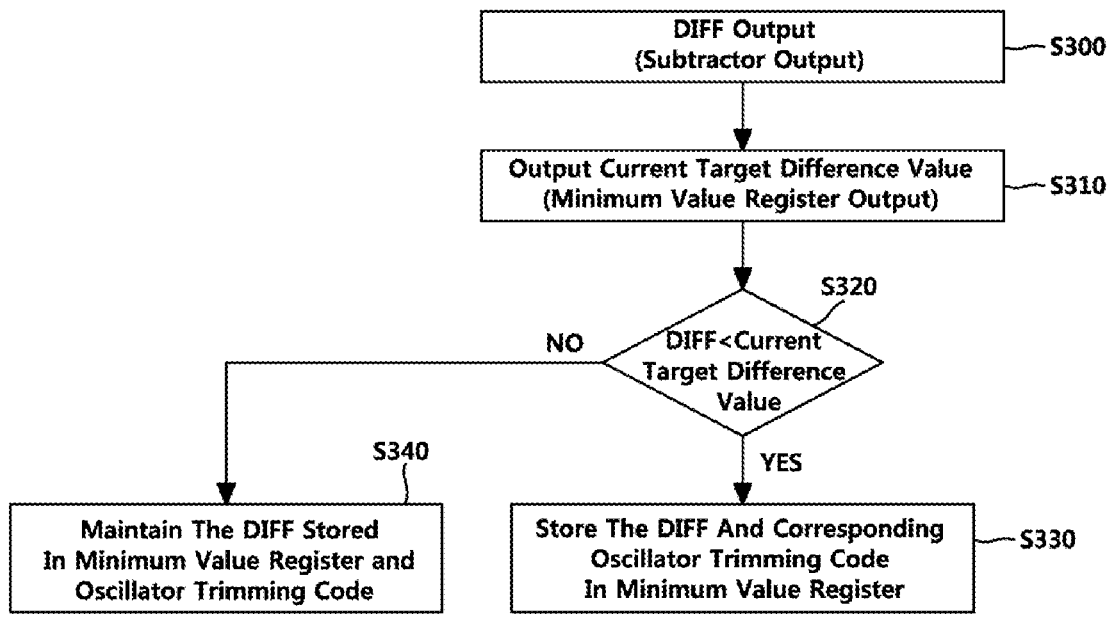
FIG. 8 is a flow chart illustrating an operation of a comparator, according to one or more examples.

FIG. 8 is a flow chart illustrating the operation of the comparator, according to one or more examples.

Referring to FIG. 8, when the subtractor 130 outputs a difference value DIFF in operation S300, the comparator 160 may receive the difference value DIFF.

In operation S310, the comparator 160 may refer to the current target difference value in the minimum value register 180.

In operation S320, when the difference value DIFF is smaller than the current target difference value, the comparator 160 may output the corresponding difference value DIFF to the minimum value register 180. The minimum value register 180 may store the received difference value DIFF as a current target difference value, and may receive and store the corresponding oscillator trimming code from the index value register 170, in operation S330.

In operation S320, the comparator 160 may maintain the current target difference value stored in the minimum value register 180, when the difference value DIFF is greater than the current target difference value. Therefore, the target difference value stored in the minimum value register 180 and the oscillator trimming code may be maintained to be the same as previously in operation S340.

Figure 9:
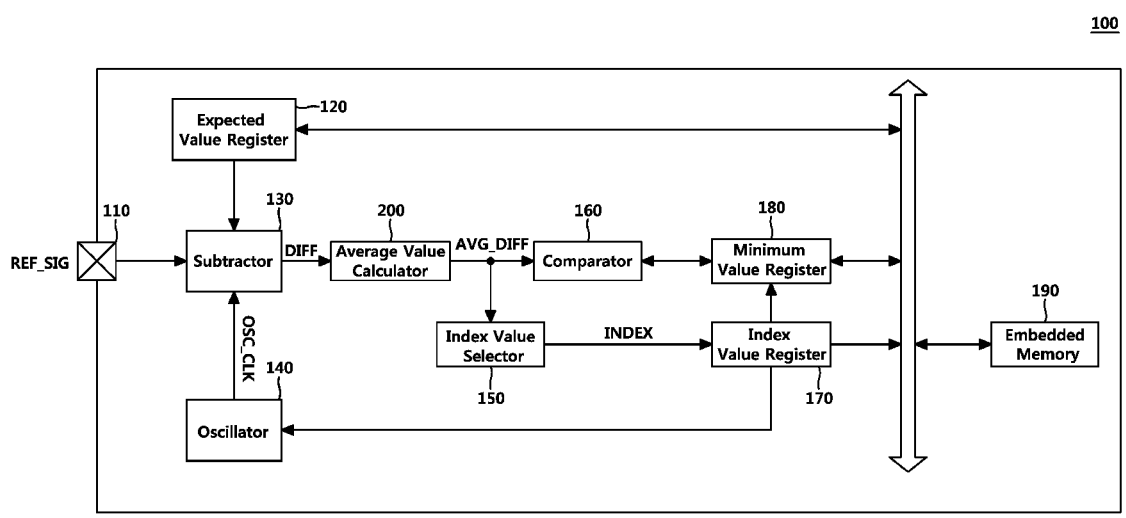
FIG. 9 illustrates a configuration of an auto trimming device of an oscillator, according to one or more examples.

FIG. 9 illustrates a configuration of an auto trimming device of an oscillator, according to one or more examples.

Referring to FIG. 9, the auto trimming device 100 for the oscillator according to one or more examples may further include an average value calculator 200.

The average value calculator 200 may calculate and output an average difference value AVG_DIFF from the plurality of difference values, after receiving the difference value DIFF output by the subtractor 130 a plurality of times.

The average value calculator 200 may compensate for an operation error due to the clock of the subtractor 130 by calculating and outputting an average difference value AVG_DIFF.

Specifically, the average value calculator 200 may calculate and output an average difference value AVG_DIFF by using a plurality of difference values previously received,

TABLE 1

| M | Difference Value DIFF | Search Result | Target Index Value | Frequency (Hz) |
|---|---|---|---|---|
| 8 | 12530 − 12000 = +530 | $+2^8 = +256$ | =201 + 256 (=457) −> 111001001 | 14560 Hz |
| 7 | 12530 − 14560 = −2030 | $-2^7 = -128$ | =457 − 128 (=329) −> 101001001 | 13280 Hz |
| 6 | 12530 − 13280 = −750 | $-2^6 = -64$ | =329 − 64 (=265) −> 100001001 | 12640 Hz |
| 5 | 12530 − 12640 = −110 | $-2^5 = -32$ | =265 − 32 (=233) −> 011101001 | 12320 Hz |
| 4 | 12530 − 12320 = +210 | $+2^4 = +16$ | =233 + 16 (=249) −> 011111001 | 12480 Hz |
| 3 | 12530 − 12480 = +50 | $+2^3 = +8$ | =249 + 8 (=257) −> 100000001 | 12560 Hz |
| 2 | 12530 − 12560 = −30 | $-2^2 = -4$ | =257 − 4 (=253) −> 011111101 | 12520 Hz |
| 1 | 12530 − 12520 = +10 | $+2^1 = +2$ | =253 + 2 (=255) −> 011111111 | 12540 Hz | after receiving the value output by the subtractor 130 for more than a predetermined number of times.

The predetermined number of times may be set to various values, in consideration of the efficiency of auto trimming. In a non-limiting example where the predetermined number of times is 3, the average value calculator 200 may calculate the average difference value AVG_DIFF by adding all of the plurality of difference values DIFF1, DIFF2, and DIFF3 and by dividing them by 3.

Figure 10:
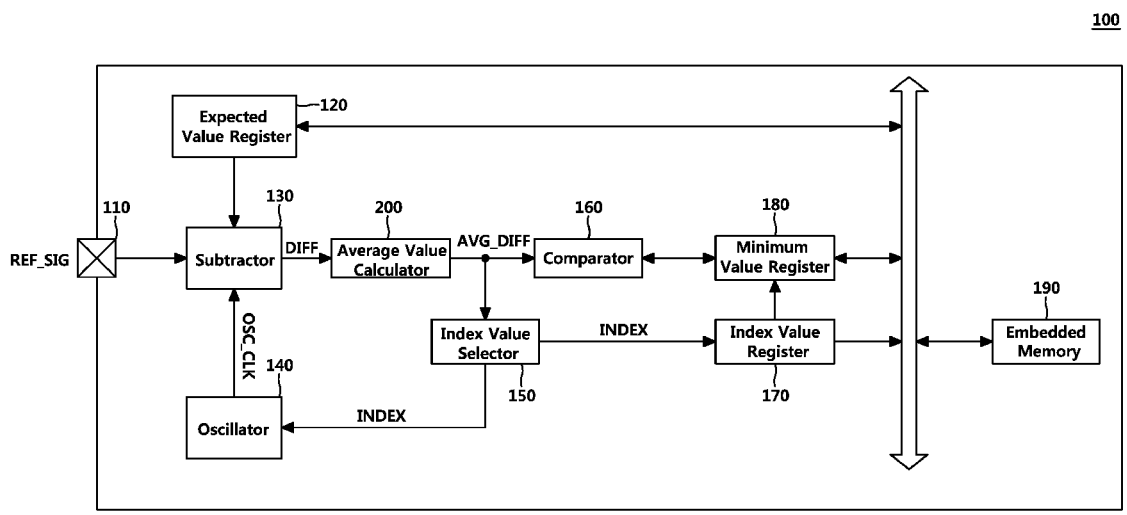
FIG. 10 illustrates another configuration of an auto trimming device of an oscillator. according to one or more examples.

FIG. 10 illustrates another configuration of an auto trimming device of an oscillator, according to one or more examples.

Referring to FIG. 10, when the target index value and the oscillator trimming code are the same value, the index value selector 150 may output the target index value to the oscillator 140 and store the target index value in the index value register 170. The description of the operation of the remaining components is the same as the description of FIG. 9, which is omitted for brevity.

Figure 11:
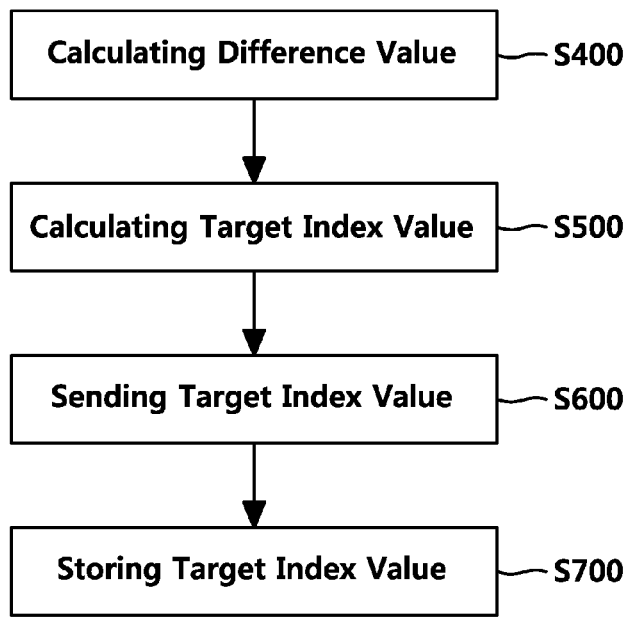
FIG. 11 is a flowchart illustrating an auto trimming method of an oscillator, according to one or more examples.

FIG. 11 is a flowchart illustrating an auto trimming method of an oscillator, according to one or more examples.

Referring to FIG. 11, the auto trimming method of the oscillator according to an example may include calculating a difference value step in operation S400, calculating a target index value step in operation S500, sending the target index value step in operation S600, and storing the target index value step in operation S700.

In the calculating a difference value step in operation S400, the difference between the expected value of the target frequency and the number of clocks of the oscillator signal may be output as a difference value during the section in which the reference time signal of the subtractor 130 is high in value.

The calculating difference value step in operation S400 may include a first calculating step in which the subtractor 130 calculates and outputs the difference value, and a second calculating step in which an average value calculator 200 calculates and outputs the average difference value from a plurality of the difference value after receiving the difference value for a plurality of times.

In calculating a target index value step in operation S500, the index value selector 150 may calculate a unit index value using the difference value, and may detect and output a target index value from the unit index value. More particularly, calculating a target index value step in operation S500 may include a unit calculating step and a fine calculating step.

In the unit calculating step, the divider 151 may calculate a unit index value from the difference value, and the index value calculator 154 may calculate and output the target index value from the unit index value.

In the fine calculating step, the binary searcher 152 may search for a target index value from the difference value to output a search result, and the index value calculator 154 may calculate and output the target index value from the search result.

According to an example, the unit calculating step may be initially performed in calculating the target index value step in operation S500, after which only the fine calculating step may be repeated.

According to an example, the index value selector 150 may detect the target index value using the average difference value output by the average value calculator 200 instead of the difference value.

In sending the target index value step in operation S600, the index value register 170 may output an oscillator trimming code, corresponding to the target index value, to the oscillator 140. More particularly, sending the target index value step in operation S600 may include a minimum value determining step.

In the minimum value determining step, the comparator 160 may receive the difference value, and may outputs a smaller value, from among the previously stored minimum value and the difference value, as a target difference value.

In storing the target index value step in operation S700, the oscillator trimming code is stored in the embedded memory 190 as a target oscillator trimming code. More particularly, the embedded memory 190 may compare a difference value of the example in which the binary searcher 152 existing in the index value selector 150 has completed a search of a predetermined number of times with a target difference value stored in the minimum value register, and when the difference value is smaller than the target difference value, may output and store the oscillator trimming code stored in the index value register 170 in the embedded memory 190, or the minimum value register 180 may receive the oscillator trimming code stored in the index value register 170, and may output the oscillator trimming code to the embedded memory 190. Additionally, the embedded memory 190 may store the oscillator trimming code. If the difference value is greater than the target difference value stored in the minimum value register 180, the oscillator trimming code stored in the minimum value register 180 may be output and stored to the embedded memory 190, accordingly. In another example, when the difference value is within a predetermined range, the minimum value register 180 may receive an oscillator trimming code corresponding to the difference value from the index value register 170, and may output and store the oscillator trimming code to the embedded memory 190, subsequently.

As described above, the oscillator auto trimming method according to one or more examples may detect a target index value by performing dividing into a large range and a small range, in order to thereby improve the speed and accuracy of the auto trimming process.

The examples have been described above with the purpose of explaining methods indicative of the performance of certain functions and their relationships. The boundaries and order of these functional components and methods have been arbitrarily defined and examples used herein for convenience of description.

Alternative boundaries and orders may be defined as long as the specific functions and relationships are performed properly. Any such alternative boundaries and orders are therefore within the scope and spirit of the claimed disclosure.

In addition, the boundaries of these functional components are arbitrarily defined for convenience of description. Alternative boundaries may be defined as long as any important functions are performed properly. Likewise, flowchart blocks may also be arbitrarily defined herein to represent any important functionality.

For extended use, the flowchart block boundaries and order may have been defined and may still perform some important function. Alternative definitions of both functional components and flowchart blocks and sequences are therefore within the scope and spirit of the claimed disclosure.

The disclosure may also be described, at least in part, in terms of one or more examples. Examples of the disclosure are used herein to illustrate the disclosure, aspects, features, concepts, and/or examples thereof. Physical examples of a device, article of manufacture, machine, and/or process implementing the examples may include one or more aspects, features, concepts, examples, etc., described with reference to one or more examples described herein.

Moreover, in all of the drawings, examples may incorporate the same or similarly named functions, steps, modules, etc. which may use the same or different reference numbers, and as such, the functions, steps, modules, etc. may be the same or similar functions, steps, modules, and so on, or other ones.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An auto trimming device, comprising:
   an oscillator configured to generate an oscillator clock signal;
   a subtractor configured to receive an expected value for a target frequency and the oscillator clock signal, configured to output a difference value between the expected value and the oscillator clock signal;
   a comparator configured to receive the difference value from the subtractor;
   an index value selector configured to calculate a unit index value using the difference value and configured to detect and output a target index value from the unit index value;
   an index value register configured to output an oscillator trimming code corresponding to the target index value to the oscillator; and
   an embedded memory configured to store the oscillator trimming code as a target oscillator trimming code for the target frequency.

2. The auto trimming device of claim 1, wherein the subtractor is configured to receive a reference time signal,
   wherein the expected value is a number of clocks of the target frequency during a section in which the reference time signal is high, and
   wherein the difference value is a value obtained by subtracting the number of clocks of the oscillator clock signal during the section in which the reference time signal is high from the expected value.

3. The auto trimming device of claim 1, wherein the index value selector comprises:
   a divider configured to calculate a unit index value from the difference value;
   a binary searcher configured to search for a target index value from the difference value to output a search result; and
   an index value calculator configured to calculate the target index value using the unit index value or the search result.

4. The auto trimming device of claim 3, wherein the index value selector comprises a current index value register configured to maintain a target index value output from the index value selector until the next target index value is output.

5. The auto trimming device of claim 3, wherein the index value calculator is configured to calculate the target index value using the unit index value only at the time of initial calculation.

6. The auto trimming device of claim 5, wherein the index value calculator is configured to calculate the target index value using a search result of the binary searcher for a predetermined number of times after outputting the target index value using the unit index value.

7. The auto trimming device of claim 1, further comprising:
   a minimum value register configured to provide a target difference value compared with the subtractor output in the comparator.

8. The auto trimming device of claim 1, wherein the embedded memory is configured to store the oscillator trimming code as the target oscillator trimming code, in response to the difference value being within a predetermined range, or configured to store the oscillator trimming code corresponding to the case when the difference value is a minimum as the target oscillator trimming code, in response to the index value register receiving the target index value for a predetermined number of times.

9. The auto trimming device of claim 1, further comprising:
   an average calculator configured to receive the difference value for a plurality of times and to calculate and output an average difference value from a plurality of difference values,
   wherein the index value selector is configured to detect the target index value using the average difference value.

10. An auto trimming device, comprising:
    an oscillator configured to generate an oscillator clock signal;
    a subtractor configured to receive an expected value for a target frequency and the oscillator clock signal to output a difference value between the expected value and the oscillator clock signal;
    a comparator configured to receive the difference value from the subtractor;
    an index value selector configured to calculate a unit index value using the difference value and configured to detect a target index value from the unit index value to provide to the oscillator;
    an index value register configured to receive and store the target index value; and
    an embedded memory configured to store the target index value for the target frequency.

11. The auto trimming device of claim 10, wherein the embedded memory is configured to store a target index value in response to the difference value being within a predetermined range, or a target index value corresponding to the case when the difference value is a minimum, in response to the index value register receiving the target index value for a predetermined number of times.

12. A method for auto trimming, comprising:
    calculating a difference value, by using a subtractor, to output a difference between an expected value of a target frequency and a number of clock of an oscillator signal as a difference value during a section in which a reference time signal is high;

calculating a target index value, by using an index value selector, to calculate a unit index value using the difference value, and detecting and outputting the target index value from the unit index value;

sending the target index value, by using an index value register, to output an oscillator trimming code corresponding to the target index value to an oscillator;

receiving the difference value from the subtractor, by using a comparator, to output a smaller value from among the received difference value and a minimum value previously stored in a minimum value register as a target difference value; and storing the target index value, by using an embedded memory, to store the oscillator trimming code as a target oscillator trimming code.

13. The method for auto trimming of claim 12, wherein the calculating the target index value comprises:

performing a unit calculating, by using a divider, to calculate a unit index value from the difference value, and using an index value calculator to calculate and output the target index value from the unit index value; and performing a fine calculating, by using a binary searcher, to search for a target index value from the difference value and to output a search result, and using the index value calculator to calculate and output the target index value from the search result.

14. The method for auto trimming of claim 13, wherein the calculating the target index value comprises:

initially performing the unit calculating, and then performing the fine calculating.

15. The method for auto trimming of claim 12, wherein the storing the target index value comprises:

storing, by the embedded memory, the oscillator trimming code as the target oscillator trimming code in response to the difference value being within a predetermined range or storing the oscillator trimming code, corresponding to the case when the difference value is a minimum as the target oscillator trimming code, in response to the index value register receiving the target index value for a predetermined number of times.

16. The method for auto trimming of claim 15, wherein the storing the target index value comprises:

outputting a target oscillator trimming code stored in the embedded memory, from the minimum value register, in response to the difference value being within a predetermined range.

17. The method for auto trimming of claim 15, wherein the storing the target index value comprises:

outputting the target oscillator trimming code stored in the embedded memory, from the index value register or a minimum value register, in response to the target index value being received by the index value register for a predetermined number of times.

18. The method for auto trimming of claim 12, wherein the calculating a difference value comprises:

performing a first calculating, in which the subtractor calculates and outputs the difference value; and performing a second calculating, in which an average value calculator calculates and outputs an average difference value from the plurality of difference values after receiving the difference value for a plurality of times, wherein the calculating the target index value comprises:

detecting, using the index value selector, the target index value using the average difference value.

19. A method for auto trimming, the method comprising:

calculating a difference value, by using a subtractor, to output a difference between an expected value of a target frequency and a number of clock of an oscillator signal as the difference value during a section in which a reference time signal is high;

calculating a target index value, by using an index value selector, to calculate a unit index value using the difference value, and detecting and outputting the target index value from the unit index value, the calculating comprising a unit calculating and a fine calculating; and sending the target index value, by using an index value register, to output an oscillator trimming code corresponding to the target index value to an oscillator for storage as a target oscillator trimming code, wherein the fine calculating comprises using a binary searcher to search for the target index value from the difference value and output a search result, and using an index value calculator to calculate and output the target index value from the search result.

20. The method for auto trimming of claim 19, wherein the unit calculating comprises using a divider to calculate a unit index value from the difference value, and using an index value calculator to calculate and output the target index value from the unit index value.

21. The method for auto trimming of claim 19, wherein the target oscillator trimming code is stored in an embedded memory.

* * * * *